United States Patent
Furuya et al.

(10) Patent No.: US 12,347,699 B2
(45) Date of Patent: *Jul. 1, 2025

(54) SUPPLY TANK, SUPPLY DEVICE AND SUPPLY SYSTEM

(71) Applicant: SHIBAURA MECHATRONICS CORPORATION, Yokohama (JP)

(72) Inventors: Masaaki Furuya, Yokohama (JP); Hiroaki Kobayashi, Yokohama (JP); Hideki Mori, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 422 days.

This patent is subject to a terminal disclaimer.

(21) Appl. No.: 17/942,520

(22) Filed: Sep. 12, 2022

(65) Prior Publication Data
US 2023/0077617 A1    Mar. 16, 2023

(30) Foreign Application Priority Data
Sep. 13, 2021    (JP) .................................. 2021-148834

(51) Int. Cl.
    *H01L 21/67*      (2006.01)
(52) U.S. Cl.
    CPC ............................... *H01L 21/6708* (2013.01)
(58) Field of Classification Search
    None
    See application file for complete search history.

(56) References Cited

U.S. PATENT DOCUMENTS

| | | | | |
|---|---|---|---|---|
| 2008/0196743 | A1* | 8/2008 | Shibata | H01L 21/6708 134/3 |
| 2009/0078582 | A1* | 3/2009 | Kobayashi | H01L 21/67051 204/263 |
| 2009/0301973 | A1* | 12/2009 | Hanna | B01F 25/421 210/205 |
| 2011/0143549 | A1* | 6/2011 | Tange | H01L 21/02057 257/E21.214 |
| 2015/0107622 | A1* | 4/2015 | Takaki | H01L 21/67017 134/198 |
| 2023/0077617 | A1* | 3/2023 | Furuya | H01L 21/67253 156/345.11 |

FOREIGN PATENT DOCUMENTS

| JP | 2004228467 A | * | 8/2004 |
|---|---|---|---|
| JP | 2007258462 A | | 10/2007 |

* cited by examiner

*Primary Examiner* — Sylvia MacArthur
(74) *Attorney, Agent, or Firm* — Nath, Goldberg & Meyer; Jared L. Meyer

(57) ABSTRACT

According to one embodiment, provided is a supply tank a supply device, and a supply system that stabilizes the liquid temperature of a process liquid to be supplied to a substrate processing device. A supply tank that supplies a process liquid to a substrate processing device includes a container that stores the process liquid, a first dividing plate that divides the container into a first region where the process liquid is introduced, and a second region that supplies the process liquid to the substrate processing device, first piping that feeds, to the second region, the process liquid introduced in the first region, and a first heater which is provided on a path through the first piping, and which heats the process liquid.

7 Claims, 3 Drawing Sheets

SUPPLY TANK, SUPPLY DEVICE AND SUPPLY SYSTEM

CROSS-REFERENCE TO RELATED APPLICATION

This application is based upon and claims the benefit of priority from Japan Patent Application No. 2021-148834, filed on Sep. 13, 2021, the entire contents of which are incorporated herein by reference.

FIELD OF THE INVENTION

The present disclosure relates to a supply tank, a supply device and a supply system.

BACKGROUND

Batch-type substrate processing devices that collectively impregnate a plurality of substrates with a process liquid, and single-wafer-type substrate processing devices that supply a process liquid to each of the substrates one by one are known as wet-etching devices that execute etching on a film laminated on a substrate, such as a semiconductor wafer or a glass, by a process liquid.

According to the batch-type substrate processing device, since a plurality of substrates is collectively processed, there is an advantage from the standpoint of productivity. In contrast, according to the single-wafer-type substrate processing device, since the substrate is processed one by one, there is a disadvantage in productivity in comparison with the batch-type substrate processing device, but extra-fine and uniform etching is enabled. In recent years, in particular, since microfabrication of a pattern on a substrate is advancing, a frequency at which single-wafer-type substrate processing device is applied is becoming high.

According to a single-wafer-type substrate processing device, in order to enable extra-fine and uniform etching, it is necessary to strictly control the temperature of a process liquid to be supplied to a substrate. Although the temperature of the process liquid is maintained at, for example, 160° C., when even 1° C. changes therefrom, an etching rate remarkably changes, resulting in non-uniformity in the etching depth. Accordingly, it is desirable that the change in the temperature of the process liquid should be suppressed within, for example, 0.2° C.

Meanwhile, since such a process liquid is relatively expensive, it is collected after etching, and is reutilized with the temperature being adjusted. For example, as disclosed in the following Patent Document 1, a process liquid utilized for etching is once collected in a tank, and after the liquid temperature is adjusted, such a process liquid is supplied again to a substrate.

SUMMARY OF THE INVENTION

A plurality of substrate processing devices is often connected to such a tank from the standpoint of efficiency. That is, the single tank collects the process liquid utilized in the plurality of substrate processing devices, and supplies the process liquid in the tank to the plurality of substrate processing devices. Hence, when the timings of substrate processing at the respective substrate processing devices overlap, the tank may collect a large amount of process liquid at once, and may supply a large amount of process liquid at once. Moreover, even if it is connected only to a single substrate processing device, the collection timing of the process liquid may vary when, for example, the substrate processing device is suspended.

In any cases, because of such technical problems, the change in the temperature of the process liquid in the tank becomes large, and the temperature control becomes difficult. When, for example, the plurality of substrate processing devices is connected and the amount of the process liquid to be collected increases due to the overlap of the substrate processing timings, since the temperature of the process liquid in the tank remarkably decreases, there is a possibility such that a sufficient heating time cannot be taken before the process liquid is supplied. Process liquid supply may be suspended until it is fully heated. In this case, however, since the temperature of the process liquid in the tank changes over time due to a change in the amount of the process liquid collected irregularly and at a variable amount, it is inevitable that an error in the temperature control becomes large. Moreover, when the temperature of the process liquid in the tank remarkably decreases, it is necessary to increase the heater output. However, it takes a time to decrease the heater output that has been once increased. Hence, in this case, the temperature control also becomes difficult due to an extra-heating of the process liquid in the tank. As described above, because of two factors that are the collection of the process liquid and the control on the heater, a sufficient temperature control cannot be executed on the process liquid, causing the non-uniformity in the etching depth to a substrate.

An objective of the present disclosure is to provide a supply tank a supply device, and a supply system that stabilizes the liquid temperature of a process liquid to be supplied to a substrate processing device.

A supply tank according to the present disclosure is a supply tank that supplies a process liquid to a substrate processing device, and includes:
  a container that stores the process liquid;
  a first dividing plate that divides the container into a first region where the process liquid is introduced, and a second region that supplies the process liquid to the substrate processing device;
  first piping that feeds, to the second region, the process liquid introduced in the first region;
  a first heater which is provided on a path through the first piping, and which heats the process liquid; and
  a second dividing plate that divides the second region into a third region where the process liquid is fed from the first piping, and a fourth region that supplies the process liquid to the substrate processing device,
  wherein:
  the first dividing plate is provided on one side of the container to which the end of the first dividing plate is connected, and is provided with an opening which causes the first region and the second region to be in communication with each other; and
  the second dividing plate is provided at an other side-surface side that is an opposite side to the one side surface of the container, and is provided with an opening which causes the third region and the fourth region to be in communication with each other.

Moreover, a supply device and a supply system both including the above-described supply tank are also embodiments of the present disclosure.

The supply tank according to the present disclosure can stabilize the liquid temperature of a process liquid to be supplied to a substrate processing device.

DETAILED DESCRIPTION OF THE EMBODIMENTS

Figure 1:
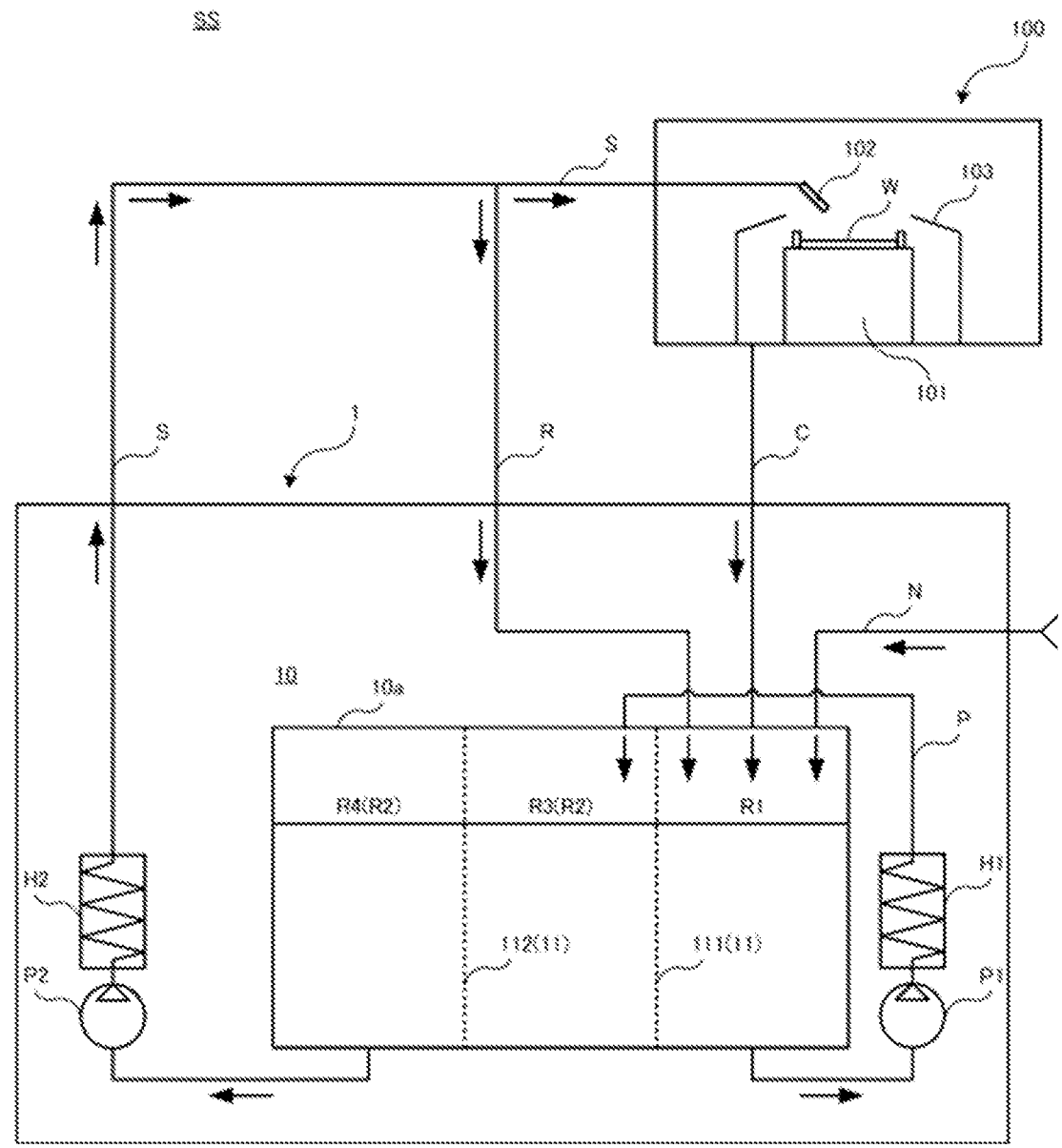
FIG. 1 is a diagram illustrating a substrate processing device and a supply device both according to an embodiment.

Embodiments of the present disclosure will be described below with reference to the accompanying figures. As illustrated in FIG. 1, a supply device 1 according to this embodiment collects a process liquid from a substrate processing device 100, and supplies the process liquid to the substrate processing device 100. Moreover, although it is not illustrated in FIG. 1, the plurality of substrate processing devices 100 is provided for the single supply device 1. A system that circulates the process liquid by such supply device 1 and by such substrate processing devices 100 will be defined as a supply system SS.

(Substrate Processing Device)

The substrate processing device 100 is a single-wafer-type substrate processing device that supplies the process liquid to a substrate W, such as a semiconductor wafer or a glass, to execute etching. The substrate processing device 100 includes a rotary driving unit 101 that holds and rotates the substrate W, a process liquid supplying unit 102 that supplies the process liquid to the substrate W, and a process liquid collecting unit 103 that collects the process liquid which is supplied to the substrate W.

The rotary driving unit 101 is a spin chuck which holds the edge of the substrate W by, for example, chuck pin, and which rotates the holding substrate W around an axis that intersects perpendicularly to the substrate W. The process liquid supplying unit 102 is a nozzle which is provided above, for example, the rotary driving unit 101, and which discharges the process liquid toward a surface of the substrate W that is being rotated by the rotary driving unit 101. The other end of the nozzle is connected to the supply device 1 through piping S to be described later. Note that a single process liquid supplying unit 102 may be provided for the surface of the substrate W, or the plurality of such units may be provided. The process liquid is an acid-based liquid, such as fluoric acid, phosphoric acid, or sulfuric acid. The process liquid collecting unit 103 is a casing which is provided so as to surround, for example, the rotary driving unit 101, and which collects the process liquid overflown from the surface of the substrate W through a bottom portion. That is, the bottom portion of the process liquid collecting unit 103 is provided with an opening, and this opening is connected to the supply device 1 through piping C to be described below.

(Supply Device)

The supply device 1 heats the process liquid collected from the substrate processing devices 100 after etching, and supplies such a liquid again to the substrate processing devices 100. The supply device 1 includes the piping C that is collect piping which collects the process liquid from the process liquid collecting unit 103 of each substrate processing device 100 after etching, a supply tank 10 which is connected to the piping C and which stores the process liquid collected through the piping C, and piping S that is supply piping which is connected to the supply tank 10 and which supplies the process liquid to the process liquid supplying unit 102 of each substrate processing device 100 from the supply tank 10.

Figure 2:
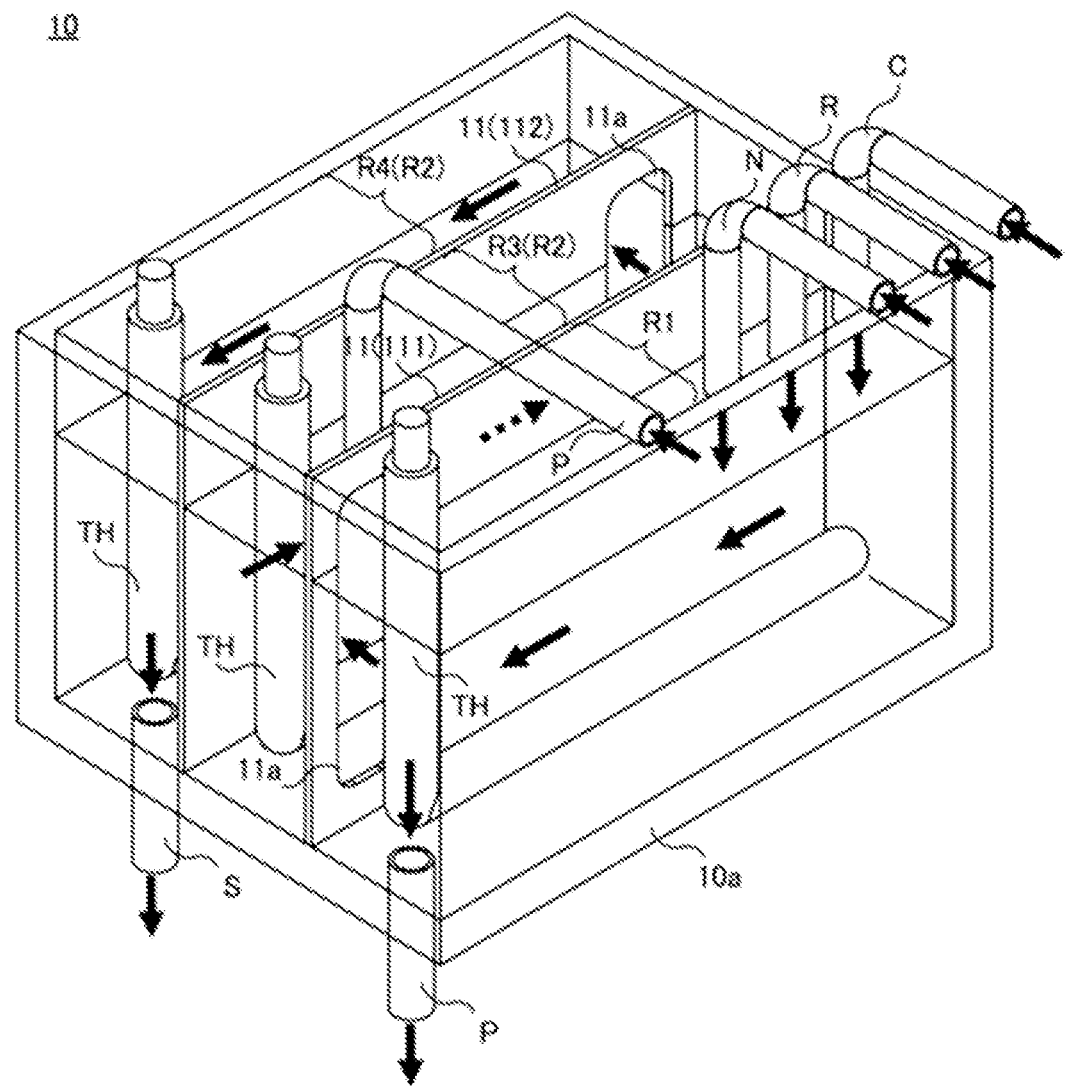
FIG. 2 is a transparent perspective view illustrating a supply tank according to the embodiment.

The supply tank 10 includes a container 10a in a rectangular shape to store the process liquid. The container 10a is formed of a material that has a corrosion resistance to the process liquid. As illustrated in FIG. 2, the container 10a is divided into a plurality of regions by dividing plates 11. In FIG. 2, the three regions are divided by the two dividing plates 11. The container 10a is initially divided into a first region R1 in which the process liquid is introduced from the piping C, and also piping N and piping R both to be described later, and a second region R2 connected to the piping S. Moreover, the second region R2 is divided into a region R3 which adjoins to the first region R1 and in which the process liquid is introduced from the first region R1, and a region R4 which adjoins to the region R3, is connected to the piping S, and supplies the process liquid to each substrate processing device 100. Note that when the two dividing plates 11 are distinguished from each other, the dividing plate 11 that divides the first region R1 and the second region R2 will be defined as a first dividing plate 111, and the dividing plate 11 that divides the region R3 of the second region R2 and the region R4 will be defined as a second dividing plate 112. Moreover, an in-tank heater TH that maintains the temperature of the process liquid is provided in each region R1, R3 and R4.

Respective openings 11a in an elongated circular shape with the same size are formed in the first dividing plate 111 and in the second dividing plate 112, causing the regions R1 and R3, and, R3 and R4 to be in communication with each other. Since the process liquid flows through the openings 11a across the regions R1, R3 and R4, the liquid level of the process liquid becomes equal across the regions R1 and R3 and R4. Even if the amount of the process liquid in the container 10a is little, in order to allow the process liquid to flow across the regions R1, R3 and R4, the openings 11a according to this embodiment are each elongated in the direction along the liquid level. Moreover, it is preferable that the size of the opening 11a should be a size that does not prevent the process liquid from flowing in the region R4 due to a fact that the process liquid introduced in the region R3 of the second region R2 from piping P to be described later attempts to return to the first region R1 again through such opening 11a, and thus the process liquid circulates within the regions R1 and R3. Furthermore, the dividing plate 11 is formed of a material that has thermal insulation properties in addition to the corrosion resistance, and suppresses the reduction of the temperature difference of the process liquid across the regions R1, R3 and R4. Moreover, the respective positions in which the respective openings 11a of this embodiment are formed are apart from each other between the dividing plates 11 in view of preventing the temperature of the process liquid from becoming equal across the regions R1, R3 and R4. For example, as illustrated in FIG. 2, when the opening 11a of the first dividing plate 111 is formed at the one side-surface side of the container 10a to which the end of the first dividing plate 111 is connected, it is preferable that the opening 11a of the second dividing plate 112 should be provided at the other side-surface side of the container 10a which is the opposite side to the one side surface.

The piping C, the piping N and the piping R are connected to the first region R1, and the process liquid is introduced from such piping. As illustrated in FIG. 2, in the container 10a, the piping C, the piping N and the piping R are provided at the other side-surface side which is the opposite side to the one side surface of the container 10a in which the opening 11a of the first dividing plate 111 is provided. Accordingly, the process liquid introduced from the piping C, the piping N and the piping R is prevented from immediately flowing in the region R3 through the opening 11a of the first dividing plate 111. The piping C introduces the process liquid collected from each substrate processing device 100 after etching. The piping N is connected to an unillustrated process liquid supply device that includes a liquid feeding device and a valve, etc., and introduces the new process liquid corresponding to the amount that has decreased by etching, etc., at each substrate processing device 100. The decrease in the process liquid may be detected by an unillustrated level sensor, etc. Note that the piping N is provided with an unillustrated valve, etc., and can be opened or closed in conjunction with a level sensor. The piping R is return piping which is branched from the piping S, and which has a role of returning some of the supplied process liquid to the supply tank 10. Note that the piping S and the piping R are each provided with an unillustrated valve, etc., and the flow of the process liquid can be controlled by opening or closing these valves.

Furthermore, piping P is connected to the bottom of the first region R1. More specifically, as illustrated in FIG. 2, the inlet opening of the piping P is provided near the opening 11a of the first dividing plate 111. The piping P feeds the process liquid to the region R3 of the second region R2 from the bottom of the first region R1. That is, a pump P1 is provided on the path through the piping P. Moreover, a heater H1 is provided on the path through the above-described piping P, e.g., the downstream side relative to the pump P1, and the process liquid fed out from the pump P1 is heated to an aiming predetermined temperature. An example predetermined temperature is 160° C. An unillustrated temperature sensor is provided at the downstream side relative to the heater H1, and upon receiving the feedback from the temperature sensor, the output by the heater H1 is adjusted. An example temperature sensor is a thermistor. As described above, in the first region R1, the process liquid introduced from the piping C, the piping N and the piping R is suctioned by the pump P1 from the piping P, is heated and fed to the region R3 of the second region R2. Since the process liquid introduced from the piping C, the piping N and the piping R has a lower liquid temperature than that of the whole process liquid in the container 10a, such a liquid moves to the bottom of the container 10a. Hence, the process liquid introduced from the piping C, the piping N and the piping R is preferentially suctioned in comparison with the whole process liquid in the container 10a. Note that the process liquid introduced from the piping C, the piping N and the piping R is not only suctioned from the piping P but also flows in the second region R2 through the opening 11a.

The piping P is connected to the region R3 of the second region R2. More specifically, as illustrated in FIG. 2, the outlet opening of the piping P is provided near the opening 11a of the first dividing plate 111. The process liquid is introduced from the first region R1 through the piping P. When the process liquid does not flow in from the piping C, the piping N and the piping R, this process liquid mainly flows in the first region R1 through the opening 11a of the first dividing plate 111. Moreover, the process liquid introduced in the region R3 can also flow in the region R4 through the opening 11a of the second dividing plate 112.

The piping S is connected to the bottom of the region R4 of the second region R2, and the process liquid is supplied to the process liquid supplying unit 102 of each substrate processing device 100 through the piping S. The piping S suctions the process liquid from the bottom of the region R4. That is, a pump P2 is provided on the path through the piping S. Moreover, a heater H2 is provided on the path through the piping S, e.g., the downstream side relative to the pump P2, and the process liquid fed from the pump P2 is heated to an aiming predetermined temperature. An example predetermined temperature is 160° C. A temperature sensor is provided at the downstream side relative to the heater H2, and upon receiving the feedback from the temperature sensor, the output by the heater H2 is adjusted. An example temperature sensor is a thermistor. Hence, the process liquid heated to the predetermined temperature is supplied to the process liquid supplying unit 102 of each substrate processing device 100. Note that a filter that eliminates impurities from the process liquid may be provided on the path through the piping S.

(Action)

Operations of the supply device 1 that employs the above-described structure will be described. As an example, in the substrate processing device 100, the process liquid supplying unit 102 discharges the process liquid to the substrate W, and the process liquid after etching is collected from the opening of the process liquid collecting unit 103 to the piping C. The process liquid collected to the piping C is introduced in the supply tank 10 of the supply device 1. More specifically, such a liquid is introduced in the first region R1 of the supply tank 10. Some of the process liquid introduced in the first region R1 flows in the adjacent second region R2 through the opening 11a of the first dividing plate 111. In contrast, the process liquid introduced in the first region R1 is mainly suctioned through the piping P connected to the bottom of the first region R1 by the pump P1. The suctioned process liquid is heated to the aiming predetermined temperature by the heater H1 provided at the downstream side relative to the pump P1.

The process liquid heated by the heater H1 is fed to the region R3 of the second region R2 through the piping P by the pump P1. The process liquid fed to the region R3 flows in the first region R1 and in the region R4 of the second region R2 through the opening 11a of the dividing plate 11.

The process liquid that flows in the region R4 from the region R3 is suctioned to the piping S connected to the bottom of the region R4 by the pump P2. The suctioned process liquid is heated to the aiming predetermined temperature by the heater H2 provided at the downstream side relative to the pump P2. The process liquid heated by the heater H2 is supplied to the process liquid supplying unit 102 of each substrate processing device 100. Accordingly, since the process liquid supplying unit 102 can discharge the process liquid heated to the predetermined temperature, etching at a desired etching rate can be executed on the substrate W.

(Advantageous Effects)

(1) The supply tank 10 according to this embodiment is a supply tank 10 that supplies the process liquid to the substrate processing device 100, and includes the container 10a that stores the process liquid, the first dividing plate 111 that divides the container 10a into the first region R1 where the process liquid is introduced, and the second region R2 that supplies the process liquid to the substrate processing device 100, the piping P that feeds, to the second region R2, the process liquid introduced in the first region R1, and the heater H1 which is provided on the path through the piping P, and which heats the process liquid. As described above, in the supply tank 10 according to this embodiment, the process liquid heated by the heater H1 is stored in the second region R2 different from the first region R1 where the process liquid is introduced, and the process liquid is supplied from the second region R2 to the substrate processing device 100. That is, since the heat from the process liquid in the first region R1 is insulated by the first dividing plate 111, the liquid temperature of the process liquid in the second region R2 and to be supplied to the substrate processing device 100 can be stabilized. Therefore, since it is unnecessary to largely change the output by the heater H2 that heats the process liquid immediately before such a liquid is supplied to the substrate processing device 100, a control that makes such an output substantially constant is simply executed, and thus the control is facilitated. Moreover, since the process liquid in the second region R2 is once heated by the heater H1, in comparison with the process liquid in the first region R1, the liquid temperature has become high. Accordingly, the heater H2 can heat the process liquid to the predetermined temperature with relatively small output.

According to conventional technologies, since a supply tank is not provided with a dividing plate, the liquid temperature within the supply tank always changes due to the process liquid collected irregularly and at a variable amount. It is difficult to control the output of a heater that heats the process liquid so as to be a desired temperature with respect to such a changing liquid temperature. For example, the amount of the process liquid to be collected temporarily increases when the processes in the respective substrate processing devices overlap. In such a case, although the liquid temperature within the supply tank remarkably decreases, even if the output of the heater is increased in accordance with such a temperature decrease, when the amount of the process liquid to be collected later decreases, it is necessary to immediately suppress the output of the heater. In contrast, according to the supply tank 10 of this embodiment, since the process liquid in the second region R2 divided by the first dividing plate 111 is not likely to be affected by the temperature of the process liquid that is introduced irregularly and at a variable amount, the change in the output of the heater H2 that heats the process liquid in the second region R2 can be suppressed, and thus a stable control is enabled.

(2) The first dividing plate 111 according to this embodiment is provided with the opening 11a which causes the first region R1 and the second region R2 to be in communication with each other, and through which the process liquid flows. Accordingly, since some of the process liquid in the second region R2 flows in the first region R1 through the opening 11a, even if, for example, the collected process liquid does not flow in the first region R1, the flow rate of the process liquid fed by the pump P1 can be maintained. If the opening 11a is not formed in the first dividing plate 111, since the flow rate of the process liquid fed to the heater H1 from the pump P1 changes because the amount of the process liquid introduced in the first region R1 changes, it becomes difficult to control the output of the heater H1. In contrast, since the opening 11a formed in the first dividing plate 111 of this embodiment can maintain the flow rate of the process liquid fed to the heater H1 from the pump P1 or can suppress the change in the flow rate, the output control for the heater H1 is stabilized.

Furthermore, when the plurality of substrate processing device 100 is connected to the supply tank 10, depending on the substrate processing timing at each substrate processing device 100, the amount of the process liquid introduced in the first region R1 remarkably decreases. In this case, although the process liquid flows in the first region R1 from the second region R2 through the opening 11a of the first dividing plate 111, the process liquid in the second region R2 is once heated by the heater H1, thus having a high liquid temperature. Accordingly, since the liquid temperature of the process liquid suctioned from the first region R1 by the piping P is also high, the heater H1 can heat the process liquid to the predetermined temperature with relatively small output. Note that since the process liquid from the second region R2 and once heated is mixed with a new process liquid by supplying the new process liquid from the piping N in synchronization with a timing at which the amount of the process liquid introduced in the first region R1 remarkably decreases, even when the low-temperature new process liquid is filled, the heater H1 can heat the new process liquid to the predetermined temperature with relatively small output.

(3) The supply tank 10 according to this embodiment further includes the second dividing plate 112 that divides the second region R2 into the region R3 where the process liquid is fed from the piping P, and the region R4 that supplies the process liquid to the substrate processing device 100, and the second dividing plate 112 is provided with the opening 11a which causes the region R3 and the region R4 to be in communication with each other, and through which the process liquid flows. Accordingly, since the two dividing plates 11 are provided between the first region R1 where the collected process liquid is introduced and the region R4 of the second region R2 that supplies the process liquid, the liquid temperature change with respect to the process liquid to be supplied to the substrate processing device 100 can be further effectively suppressed.

(4) The opening 11a of the first dividing plate 111 according to this embodiment is formed at the one side-surface side of the container 10a to which the end of the first dividing plate 111 is connected, and the opening 11a of the second dividing plate 112 is formed at the other side-surface side of the container 10a which is the opposite side to the one side surface thereof. By arranging the respective openings 11a of the two dividing plates 11 alternately in the manner as described above, the process liquid is not likely to flow in, from the first region R1 where the process liquid is collected, the region R4 of the second region R2 that supplies the process liquid, and thus the liquid temperature change can be further effectively suppressed.

(5) The piping P according to this embodiment is provided near the opening 11a of the first dividing plate 111 in the second region R2. Accordingly, the process liquid with the low liquid temperature in the first region R1 is suppressed to flow in the second region R2. Moreover, by setting the flow rate suctioned through the piping P to be larger than the flow-in amount from the piping C, the piping N and the piping R, the process liquid flows in the first region R1 from the second region R2, and thus a rate that the liquid temperature of the process liquid in the first region R1 is decreased by the process liquid after etching can be decelerated. Hence, since the output change of the heater H1 can be suppressed, the control on the heater H1 is facilitated. Furthermore, since the process liquid that flows in the first region R1 from the second region R2 is heated again by the heater H1, the liquid temperature of the second region R2 can be further stabilized.

(6) The supply device 1 according to this embodiment includes the above-described supply tank 10, the piping S that supplies, to the substrate processing device 100, the process liquid in the second region R2, and the heater H2 which is provided on the path through the piping S and which heats the process liquid. Furthermore, the piping R is provided which is branched from the piping S and which introduces the process liquid in the container 10a. According to conventional technologies, when, for example, the process in the substrate processing device 100 is delayed, there is a possibility such that the liquid temperature of the process liquid decreases within the piping S. According to the supply device 1 of this embodiment, by causing the process liquid to circulate by the piping R, the process liquid just heated by the heater H2 can be always supplied, and thus the possibility such that the process liquid that has the decreased liquid temperature is supplied to the substrate processing device 100 can be reduced. Moreover, since the process liquid heated by the heater H2 is introduced from the piping R in the first region R1, the remarkable decrease in the liquid temperature of the process liquid in the first region R1 by the process liquid after etching and having the decreased liquid temperature can be suppressed. Accordingly, the output change of the heater H1 can be suppressed, and can be controlled stably.

Note that after the substrate processing in the substrate processing device 100 ends, the process liquid is no longer introduced from the piping C, and the process liquid in the supply tank 10 is circulated through the piping S and through the piping R. In this case, since it is sufficient for the heater H1 and the heater H2 to compensate only the heat quantity by what corresponds to the dissipated heat through the piping S and through the piping R, the process liquid can be heated to the predetermined temperature with relatively small output.

(7) The supply system SS according to this embodiment includes the above-described supply device 1, the substrate processing device 100 that processes the substrate W by the process liquid, and the piping C which collects, from the substrate processing device 100, the process liquid after the substrate W is processed, and which introduces the collected liquid in the first region R1 of the container 10a, and the piping C is provided, in the container 10a, at the other side-surface side which is the opposite side to the one side surface of the container 10a where opening 11a of the first dividing plate 111 is located. Accordingly, the process liquid which is introduced after etching from the piping C and which has the decreased liquid temperature is prevented from immediately flowing in the region R3 through the opening 11a of the first dividing plate 111, and from decreasing the liquid temperature of the process liquid in the region R3.

(Modified Examples)

This embodiment is not limited to the above-described form, and the following modified examples can be employed. For example, although the piping P and the piping S are provided with the pump P1 and the pump P2, respectively, the piping C, the piping N and the piping R may be provided with pumps, respectively. Moreover, although the piping N is connected to the first region R1, as far as it can introduce the pre-heated process liquid in the supply tank 10, it can be also connected to the second region R2. In this case, the piping N may be provided with a heater. Furthermore, although the piping R is connected to the first region R1, when the temperature decrease of the process liquid is slight, it may be connected to the region R3 or to the region R4.

Moreover, in the above-described embodiment, although the number of the dividing plates 11 is two, such a number is not limited to this example. It may be one plate or equal to or greater than three plates. What is necessary is a structure in which at least the region where the collected process liquid is introduced and the region that supplies the heated process liquid are divided, and which enables the liquid temperature to increase to the aiming temperature along the flow toward the suction opening of the piping S. Furthermore, the site in which the opening 11a is formed is not limited to the particular site, and for example, it may be formed in the center portion of the dividing plate 11. Note that the opening 11a is not limited to an elongated circular opening, it may be a slit, and a plurality of circular openings may be arranged side by side. Still further, communication piping to make the liquid level at the first region R1 and at the liquid level at the second region R2 constant may be provided as a substitute for the function of the opening 11a.

Moreover, in the above-described embodiment, although the region R3 of the second region R2 and the regions R4 are caused to be in communication with each other through the opening 11a, like a structure including the piping P and the pump P1 provided between the first region R1 and the second region R2, such regions may be caused to be in communication with each other by piping, and the process liquid may be fed to the region R4 from the region R3 by a pump provided on the path through such piping. Alternatively, without forming the opening 11a in the second dividing plate 112, by allowing the liquid level at the region R4 to reach the upper end of the second dividing plate 112, the process liquid in the region R4 may be allowed to flow in the region R3.

Furthermore, the dividing plate 11 in which the opening 11a is formed, and the dividing plate 11 in which no opening 11a is formed may be provided in combination with each other. Such an embodiment will be described with reference to FIG. 3. Note that regarding the structure illustrated in FIG. 3, only differences from FIG. 1 will be described and the description of the common components will be omitted.

Figure 3:
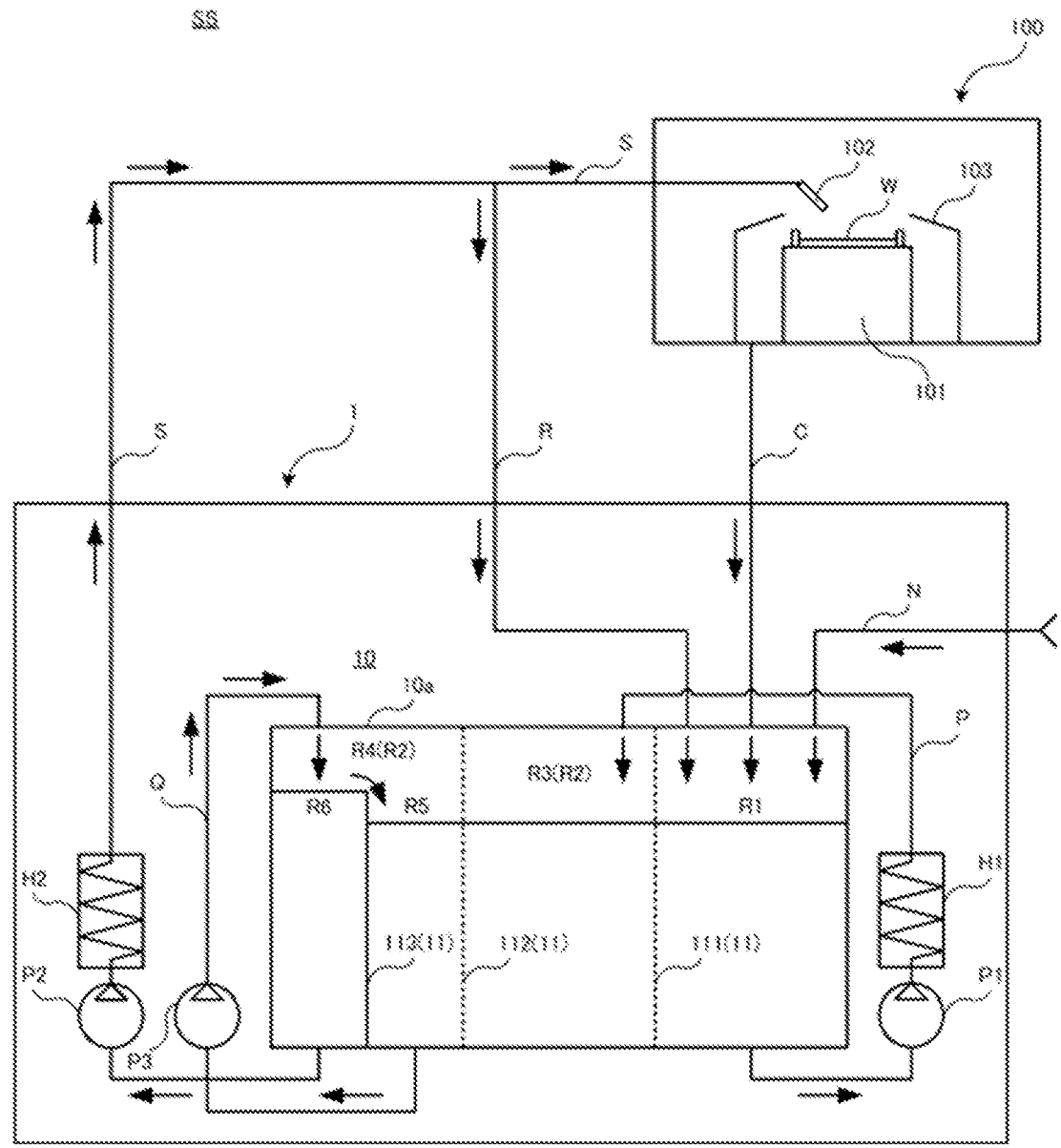
FIG. 3 is a diagram illustrating a substrate processing device and a supply device both according to a modified example of the embodiment.

In addition to the first dividing plate 111 and the second dividing plate 112, the supply tank 10 illustrated in FIG. 3 includes a third dividing plate 113. The third dividing plate 113 is provided so as to divide the region R4 of the second region R2 into a region R5 in communication with a region R3 through the opening 11a of the second dividing plate 112, and a region R6 which is connected to the piping S and which supplies the process liquid to the substrate processing device 100. As described above, no opening 11a is formed in the third dividing plate 113. Conversely, as illustrated in FIG. 3, the upper end of the third dividing plate 113 is provided at a position higher than the liquid level of the process liquid in the region R6, and at a position lower than the upper end of the side surface of the container 10a. Accordingly, when the liquid level of the process liquid becomes higher than the third dividing plate 113 in the region R6, the process liquid in the region R6 flows in the region R5 over the upper end of the third dividing plate 113.

Moreover, the piping Q is connected to the bottom of the region R5. The piping Q feeds the process liquid to the region R6 from the bottom of the region R5. That is, a pump P3 is provided on a path through the piping Q, and the process liquid in the region R5 is suctioned by the pump P3 to the piping Q, and is introduced in the region R6 in sequence. Accordingly, since the process liquid to be supplied to the substrate processing device 100 is not mixed with the process liquid in the first low region R1 with the low liquid temperature through the opening 11a, the liquid temperature can be further surely maintained. In addition, by the third dividing plate 113 in which no opening 11a is formed, the process liquid in the region R6 is insulated from the heat of the process liquid in the region R5, the temperature change is further suppressed. Accordingly, since the output change of the heater H2 becomes quite small, the control thereof is facilitated. Furthermore, by setting the output of the pump P3 to be larger than the output of the pump P2, the liquid level in the region R6 can be maintained at always constant, i.e., maintained at the height of the third dividing plate 113. Accordingly, since the flow rate of the process liquid fed to the pump P2 can be maintained at further constant, the heating control for the heater H2 can be further stabilized. Furthermore, the temperature can be further stabilized by providing a tank heater in the region R6.

(Other Embodiments)

The embodiment of the present disclosure and the modified examples of the structural components have been described above, but the embodiment and the modified examples of the structural components are merely presented as examples, and are not intended to limit the scope and spirit of the present disclosure. The above-described novel embodiment, etc., can be carried out in other various forms, and various omissions, replacements and modifications can be made thereto without departing from the scope and spirit of the present disclosure. Such embodiments and modified examples thereof fall within the scope and spirt of the present disclosure, and also fall within the scope and spirit of the invention as recited in claims.

What is claimed is:

1. A supply tank that supplies a process liquid to a substrate processing device comprising:
   a container that stores the process liquid;
   a first dividing plate that divides the container into a first region and a second region, collect piping being connected to the first region, the collect piping collecting the process liquid from the substrate processing device after processing of a substrate, the process liquid being introduced into the first region from the substrate processing device via the collect piping, the second region supplying the process liquid to the substrate processing device;
   first piping that feeds, to the second region, the process liquid introduced in the first region;
   a first heater which is provided on a path through the first piping, and which heats the process liquid; and
   a second dividing plate that divides the second region into a third region where the process liquid is fed from the first piping, and a fourth region that supplies the process liquid to the substrate processing device,
   wherein:
   the first dividing plate is provided on one side of the container to which the end of the first dividing plate is connected, and is provided with an opening which causes the first region and the second region to be in communication with each other; and
   the second dividing plate is provided at an other side-surface side that is an opposite side to the one side surface of the container, and is provided with an opening which causes the third region and the fourth region to be in communication with each other.

2. The supply tank according to claim 1, wherein the first piping is provided near the opening of the first dividing plate in the second region.

3. The supply tank according to claim 1, further comprising:
   a third dividing plate that divides the fourth region into a fifth region which is in communication with the third region through the opening of the second dividing plate, and a sixth region that supplies the process liquid to the substrate processing device; and
   second piping that feeds the process liquid in the fifth region to the sixth region,
   wherein:
   the third dividing plate is provided with an opening through which the process liquid flows in the fifth region; and
   an upper end of the third dividing plate is located at a position higher than a liquid level off the process liquid in the fifth region and at a position lower than an upper end of the side surface of the container.

4. A supply device comprising:
   the supply tank according to claim 1;
   supply piping that supplies, to the substrate processing device, the process liquid in the second region; and
   a second heater which is provided on a path through the supply piping and which heats the process liquid.

5. The supply device according to claim 4, further comprising return piping which is branched from the supply piping and which introduces the process liquid in the container.

6. A supply system comprising:
   the supply device according to claim 4;
   a substrate processing device that processes a substrate by the process liquid; and
   the collect piping which collects, from the substrate processing device, the process liquid after the substrate is processed, and which introduces the collected liquid in the first region of the container.

7. The supply system according to claim 6, wherein the collect piping is provided, in the container, at the other side-surface side which is an opposite side to the one side surface of the container where the opening of the first dividing plate is located.

* * * * *